United States Patent
Cheng et al.

(10) Patent No.: US 11,711,891 B2
(45) Date of Patent: Jul. 25, 2023

(54) LENS MODULE MOUNTING ON RIGID-FLEX PRINTED CIRCUIT BOARD

(71) Applicant: JIASHAN D-MAX ELECTRONICS CO., LTD., Jiaxing (CN)

(72) Inventors: Xin-Lian Cheng, Jiaxing (CN); Hua-Nan Bao, Jiaxing (CN); Wei-Chuan Wang, Jiaxing (CN)

(73) Assignee: JIASHAN D-MAX ELECTRONICS CO., LTD., Jiaxing (CN)

( * ) Notice: Subject to any disclaimer, the term of this patent is extended or adjusted under 35 U.S.C. 154(b) by 72 days.

(21) Appl. No.: 17/348,775

(22) Filed: Jun. 16, 2021

(65) Prior Publication Data
US 2022/0408552 A1 Dec. 22, 2022

(51) Int. Cl.
| | |
|---|---|
| *H05K 1/02* | (2006.01) |
| *G02B 7/02* | (2021.01) |
| *H05K 1/14* | (2006.01) |
| *H04N 23/54* | (2023.01) |
| *H04N 23/55* | (2023.01) |

(52) U.S. Cl.
CPC ........... *H05K 1/0274* (2013.01); *G02B 7/025* (2013.01); *H04N 23/54* (2023.01); *H04N 23/55* (2023.01); *H05K 1/028* (2013.01); *H05K 1/14* (2013.01); *H05K 2201/10151* (2013.01)

(58) Field of Classification Search
CPC ........ H05K 1/0274; H05K 1/028; H05K 1/14; H05K 2201/10151; G02B 7/025; H04N 5/2253; H04N 5/2254
See application file for complete search history.

(56) References Cited

U.S. PATENT DOCUMENTS

| | | | |
|---|---|---|---|
| 10,567,625 B2* | 2/2020 | Chen | H04N 23/55 |
| 2015/0334864 A1* | 11/2015 | Feng | G06K 7/10821 361/730 |
| 2017/0273171 A1* | 9/2017 | Codd | H04N 25/617 |
| 2018/0063941 A1* | 3/2018 | Kang | H05K 1/0216 |
| 2019/0141224 A1* | 5/2019 | Park | H04N 23/55 |
| 2020/0012068 A1* | 1/2020 | Lim | H05K 1/181 |
| 2020/0137272 A1* | 4/2020 | Ding | H04N 23/54 |
| 2020/0161289 A1 | 5/2020 | Chen et al. | |

FOREIGN PATENT DOCUMENTS

| | | |
|---|---|---|
| TW | 200812362 A | 3/2008 |
| TW | M475600 U | 4/2014 |
| TW | M593559 U | 4/2020 |
| TW | M616139 U | 8/2021 |

OTHER PUBLICATIONS

Search Report dated Dec. 10, 2021 issued by Taiwan Intellectual Property Office for counterpart application No. 110120210.

* cited by examiner

*Primary Examiner* — Amy R Hsu
(74) *Attorney, Agent, or Firm* — Demian K. Jackson; Jackson IPG PLLC

(57) ABSTRACT

A lens module mounted on rigid-flex printed circuit board (PCB) includes a rigid-flex PCB unit having two rigid PCBs and a flex PCB connected to between the two rigid PCBs, and an image sensor and a lens mounted on the flex PCB. A clearance is formed between the lens and the two rigid PCBs, and is filled with clearance glue. The clearance glue reinforces joints of the flex PCB and the two rigid PCBs, and the lens module becomes an integral structure after the clearance glue is cured.

10 Claims, 6 Drawing Sheets

LENS MODULE MOUNTING ON RIGID-FLEX PRINTED CIRCUIT BOARD

FIELD OF THE INVENTION

The present invention relates to the field of lens, and more particularly, to a lens module mounted on a rigid-flex print circuit board (PCB).

BACKGROUND OF THE INVENTION

Camera lenses are important functional elements for many different electronic products, such as mobile phones, tablet computers and notebook computers. The quick development of industries of consumption products has also contribution to the high growth in the camera lens industry. Due to the demand for further reduced height of the electronic products, camera lenses that are to be mounted in the thin electronic products also need to further reduce their thickness.

Conventionally, a camera lens module can be packaged in three different ways, namely, chip-scale package (CSP), chip-on-board package (COB) and flip chip package.

The CSP has the advantages of completing the package segment by the front-end process, low dust point requirement because the chip in the CSP is covered by a layer of glass. The CSP also has the advantages of high good yield rate, low cost of production facilities and shortened process time. However, the challenges CSP has to face include poor light transmittance, relatively high price, relatively large module height and ghosting phenomenon of backlight penetration.

The flip chip package involves relatively complicated production process and high production cost. Therefore, it is uneasy for general manufacturers to use this technology.

The COB package has the advantages of better image quality, lower packaging cost and lower lens module height. Since more and more manufacturers of famous brand start asking for delivery of the lens modules manufactured by COB package, it is the future trend that the COB package will be developed into the main camera lens module process. There are two types of flex printed circuit board (FPCB) technologies available for the back-end process of the COB package, namely, hot bar soldering and anisotropic conductive film/paste (ACF/ACP) thermally pressing. Generally, the hot bar soldering is no longer used owing to a low reliability thereof. On the other hand, the ACF/ACP thermally pressing requires purchasing of additional equipment to cause largely increased production cost. In addition, in the conventional packaging technology, such as chip packaging technology, the parts assembly is directly done according to the preset tolerance parameter. When the number of superposed parts increases, the final fit tolerance becomes larger and larger to influence the final imaging effect. The general COB packaging technology does not provide any advantage and characteristic in the lens module height and the final lens installation.

That is, the good yield rate of the camera lens module packaging decreases and the lens module height increases with increased camera lens parts. Therefore, it is an important issue for related manufacturers as how to decrease the overall thickness of the camera lens module while increasing the good yield rate of the camera lens module production.

SUMMARY OF THE INVENTION

To solve the above problems, a primary object of the present invention is to provide a thin type, integral and structurally strong lens module mounted on rigid-flex PCB.

To achieve the above object, the lens module provided according to the present invention includes a rigid-flex PCB unit, which includes two rigid PCBs and a flex PCB located between and connected to the two rigid PCBs. The flex PCB defines a second thickness, which is smaller than a first thickness defined by each of the two rigid PCBs. The lens module further includes an image sensor flatly attached and electrically connected to the flex PCB and a lens aligned with the image sensor and fixed to the flex PCB. A clearance is formed between the lens and each of the two rigid PCBs, and a type of clearance glue is filled in the clearances. With the clearance glue, joints between the flex PCB and the two rigid PCBs are reinforced.

The lens module further includes a filter superposed on the image sensor.

The lens is located in an image sensing light path of the image sensor, and the image sensor is located between the lens and the filter.

The flex PCB and the rigid PCBs are connected to one another in a manner that needs not any connector or any welding procedure.

The flex PCB and the image sensor are electrically connected to one another via a plurality of conductors.

The lens module further includes two coverings separately covered on the two rigid PCBs. The clearances are formed between the lens and the coverings, and the clearance glue is also filled between the lens and the coverings.

The rigid PCBs respectively have an inner edge located adjacent to the flex PCB; and the lens has two outer sides facing toward and spaced from the two inner edges of the rigid PCBs. The clearances are formed between the outer sides of the lens and the two inner edges of the rigid PCBs.

The coverings respectively have an inner end surface flush with the two inner edges of the rigid PCBs and facing toward but spaced from the two outer sides of the lens. The clearance glue is also filled between the two inner end surfaces of the coverings and the two outer sides of the lens.

In an operable embodiment, the clearance glue is a type of curable glue.

In the lens module of the present invention, the flex PCB forms a recessed area on the rigid-flex PCB unit.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with a preferred embodiment thereof and by referring to the accompanying drawings.

In the specification of the present invention, the terms "provided", "mounted", "connected", "coupled", "fixed", etc. should be understood broadly, unless they are clearly specified otherwise. For example, these terms can describe that two things are fixedly connected, removably connected, mechanically connected, directly connected or indirectly connected via an intermediate. A person of ordinary skill in the art is able to understand the exact meaning of these terms according to the actual situations in which these terms are used.

Further, the terms "first" and "second" are only used for the purpose of describing and should not be understood as an explicit or an implied meaning of relative importance of two things or as an explicit or an implied indication of the number of technical features. Thus, technical features specified by "first" and "second" can describe explicitly or implicitly one or more technical features are included. In the present invention, the description of "more" and "a plurality of" means two or more than two in number, unless it is clearly specified otherwise.

Figure 1A:
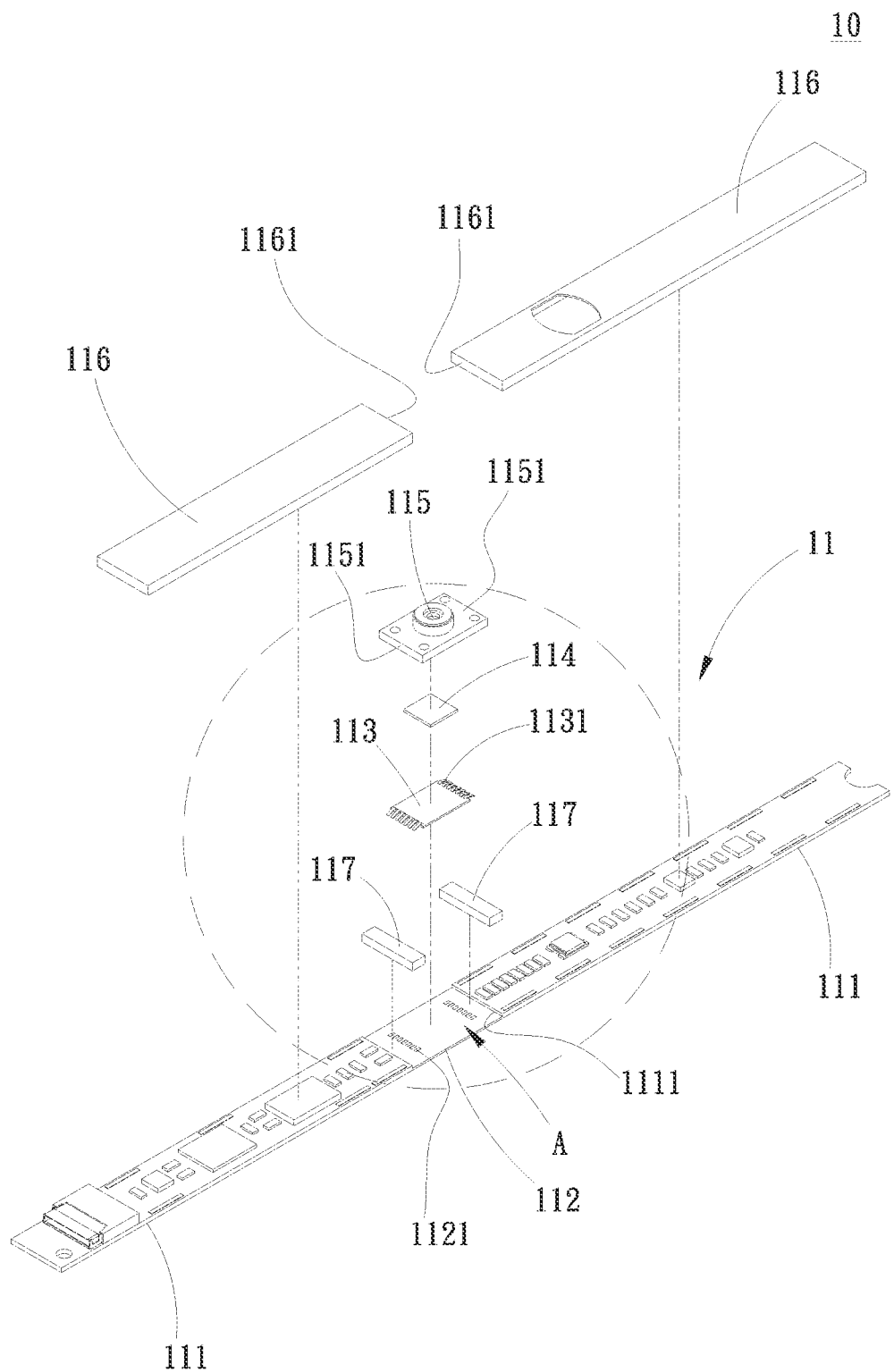
FIG. 1A is an exploded perspective view of a lens module mounted on rigid-flex printed circuit board according to an embodiment of the present invention.
Figure 1B:
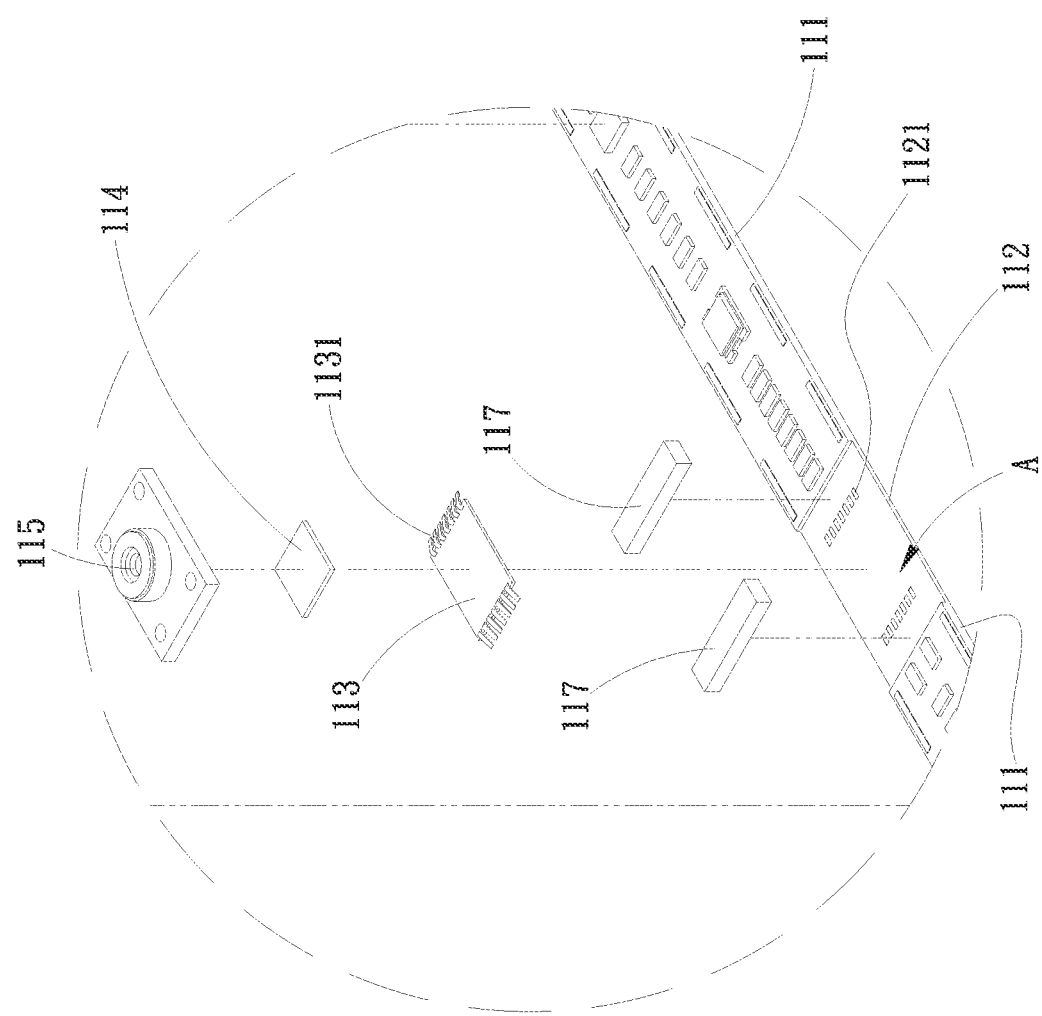
FIGS. 1B and 1C are enlarged views of the circles area of FIG. 1A.
Figure 1C:
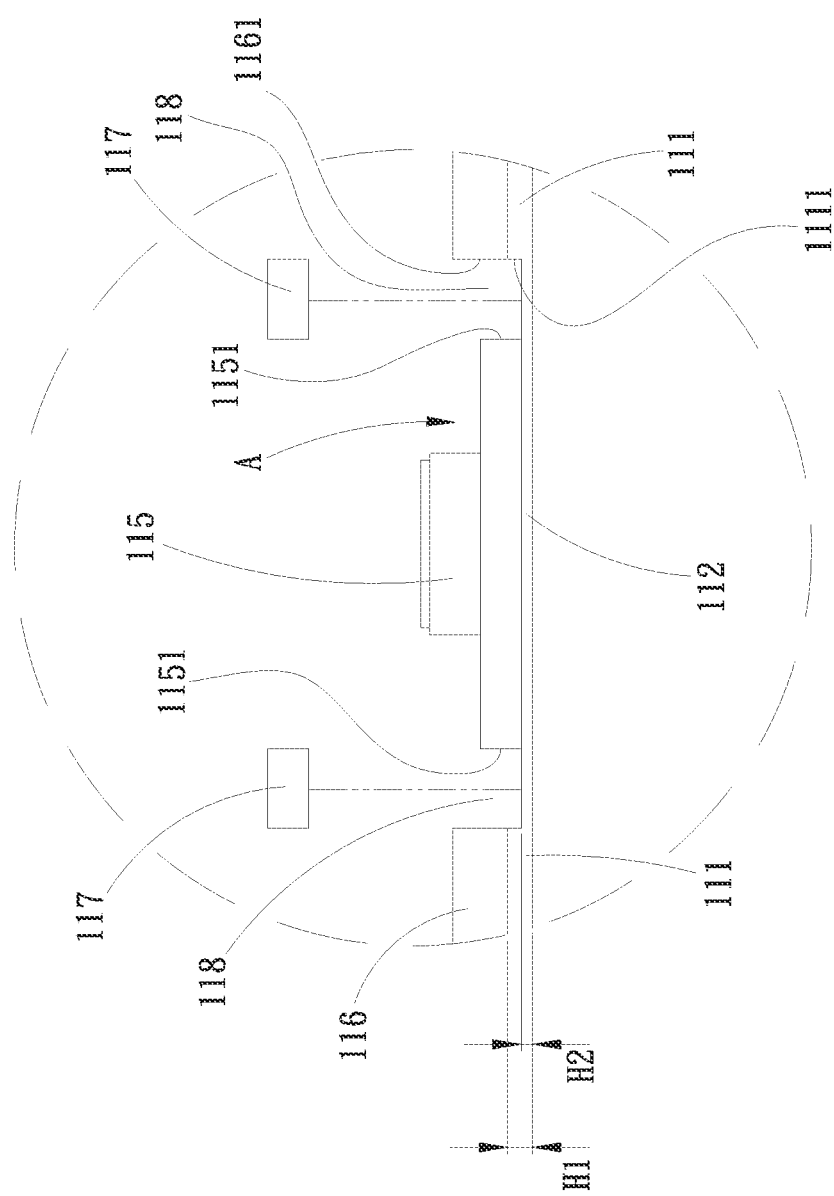
Figure 2A:
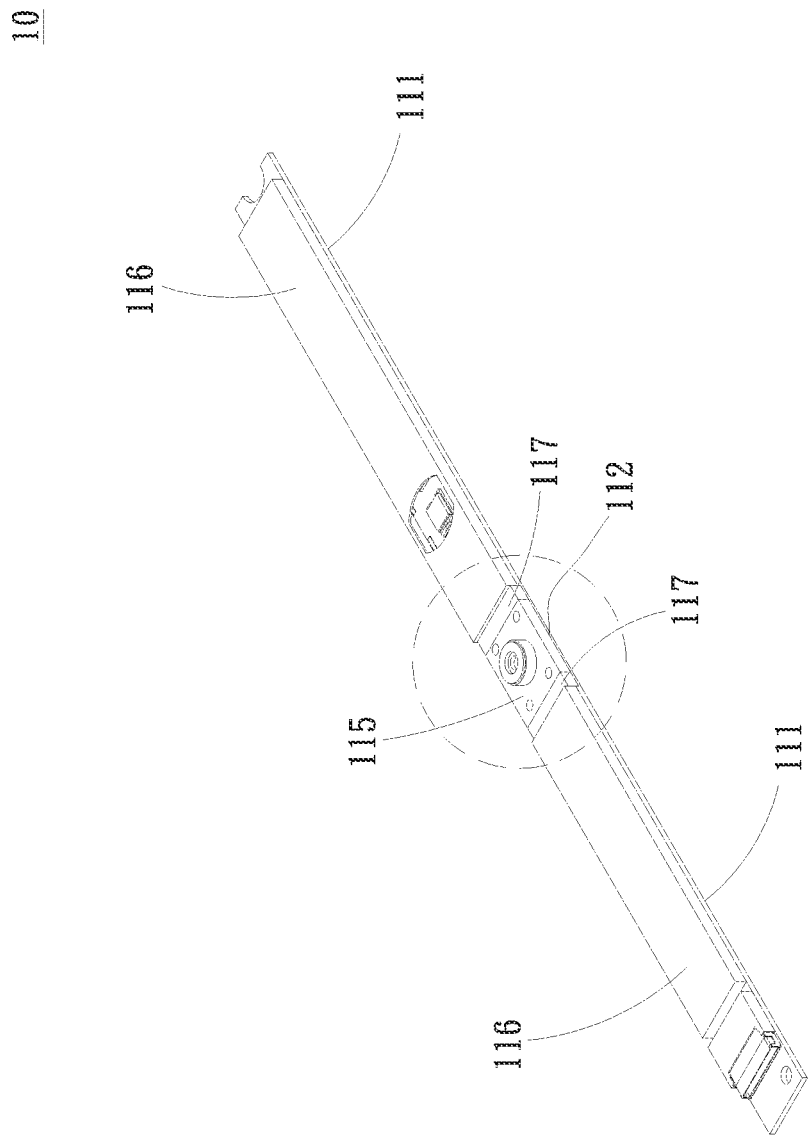
FIG. 2A is an assembled view of the lens module mounted on rigid-flex printed circuit board shown in FIG. 1A.
Figure 2B:
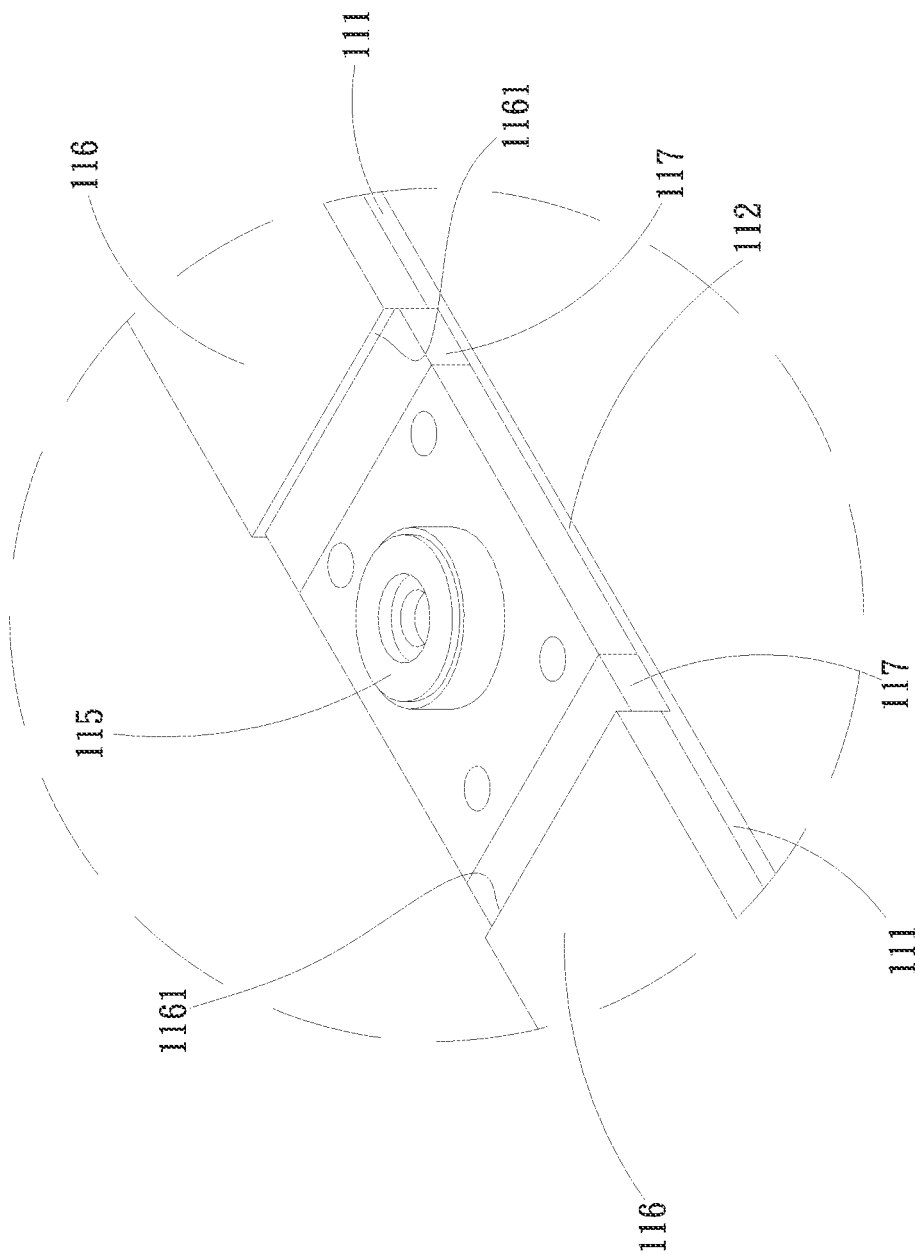
FIGS. 2B and 2C are enlarged views of the circled area of FIG. 2A.
Figure 2C:
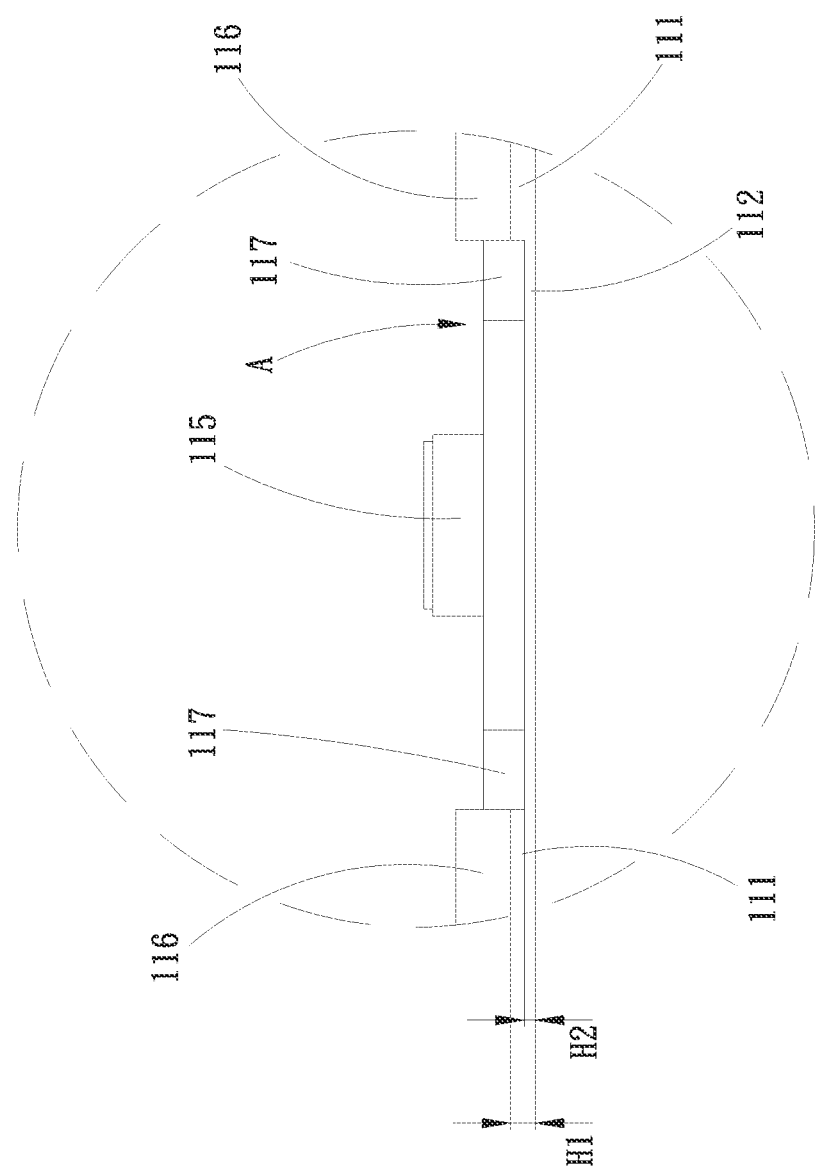

Please refer to FIGS. 1A and 2A, which are exploded and assembled perspective views, respectively, of a lens module mounted on rigid-flex printed circuit board (PCB) according to an embodiment of the present invention; to FIGS. 1B and 2B, which are enlarged, assembled views of the circled areas of FIGS. 1A and 2A, respectively; and to FIGS. 1C and 2C, which are enlarged, assembled side views of FIGS. 1A and 2A, respectively. For the purpose of conciseness and clarity, the lens module mounted on rigid-flex PCB of the present invention is also briefly referred to as the lens module herein and is generally denoted by reference numeral 10. As shown in the drawings, the lens module 10 includes a rigid-flex PCB unit 11, which serves as an element carrier. The rigid-flex PCB unit 11 is a printed circuit board including two or more pieces of rigid PCBs 111 having circuits provided thereon and electrically connected to one another via a flex PCB 112. In the illustrated embodiment, two pieces of horizontally disposed rigid PCBs 111 and one piece of flex PCB 112 are included. The flex PCB 112 is located between the two pieces of rigid PCBs 111. It is noted the flex and the rigid PCBs 112, 111 are connected together in a manner that does not need any connector or any welding procedure. For example, vias are drilled on layers of the flex PCB 112 and the rigid PCBs 111 that are to be electrically connected to one another, and then the layers are aligned with one another using a precise alignment device and bonded together. The circuits on the layers are electrically connected through the plated vias drilled on the layers of the rigid-flex PCB unit 11.

Each of the rigid PCBs 111 defines a first thickness H1 and the flex PCB 112 defines a second thickness H2. The second thickness H2 is smaller than the first thickness H1, such that a thickness difference is formed between the flex PCB 112 and the rigid PCBs 111. Due to this thickness difference, the flex PCB 112 forms a recessed area A relative to the rigid PCBs 111, as shown in FIG. 1C.

The two pieces of rigid PCBs 111 are respectively covered by a covering 116. The coverings 116 are, for example, metal (or iron) coverings or plastic coverings for shielding electronic elements on the rigid PCBs 111. The coverings 116 function to protect the electronic elements on the rigid PCBs 111 from external environment and shield electromagnetic waves produced by these electronic elements, so as to protect an image sensor 113, which will be described later, against electromagnetic interference (EMI) from these electromagnetic waves. Each of the rigid PCBs 111 has an inner edge 1111 located adjacent to the flex PCB 112, and each of the coverings 116 has an inner end surface 1161 flush with the corresponding inner edge 1111 of the rigid PCB 111.

The image sensor 113 is flatly attached and electrically connected to the flex PCB 112 and has a filter 114 superposed thereon. The image sensor 113 can be, for example, a charge-coupled device (CCD) or a complementary metal-oxide-semiconductor (CMOS), and the filter 114 can be, for example, an infrared (IR) cut-off filter for filtering off IR while allowing visible light to pass. In an operable embodiment, the flex PCB 112 is provided with a plurality of electrical or metal contacts 1121, and the image sensor 113 is provided with a plurality of conductors or electrical pins 1131 corresponding to the electrical contacts 1121 of the flex PCB 112.

A lens 115 is in alignment with the image sensor 113 and fixed to the flex PCB 112. The lens 115 is located in an image sensing light path of the image sensor 113, and the filter 114 is located between the lens 115 and the image sensor 113. A clearance 118 is existed between the lens 115 and each of the rigid PCBs and between the lens 115 and each of the two coverings 116, and the clearances 118 are filled with clearance glue 117. The clearance glue 117 can be, but not limited to, a type of curable glue that can transform from a liquid state into a solid state and features strong adhesion and quick curing speed.

In an operable embodiment, the clearance glue 117 is ultraviolet (UV) curable glue.

More specifically, the lens 15 has two outer sides 1151 respectively facing toward and spaced from the two inner edges 1111 of the rigid PCBs 111 and the two outer end surfaces 1161 of the coverings 116, such that the two clearances 118 are respectively located between the two outer sides 1151 of the lens 15 and the two inner edges 1111 and the two inner end surfaces 1161. The clearance glue 117 in the two clearances 118 not only fills up a space between the two outer sides of the lens 151 and the two outer edges 1111 of the rigid PCBs 111, but also fills up a space between the outer sides 1151 of the lens 151 and the outer end surfaces 1161 of the coverings 161. In this manner, the clearance glue 117 reinforces joints of the flex PCB 112 and the rigid PCBs 111. Further, the cured clearance glue 117 enables the lens module 10 of the present invention to be an integral structure.

In the present invention, by mounting the lens 115, the image sensor 113 and the filter 114 on the flex PCB 112 that is thinner relative to the rigid PCBs 111, the lens module 10 can have a reduced overall height and accordingly, achieve the target of becoming further thinned. Further, with the clearance glue 117, the joints between the flex PCB 112 and the rigid PCBs 111 are reinforced and the whole lens module 10 forms an integral structure.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A lens module mounted on rigid-flex printed circuit board (PCB) comprising:
   a rigid-flex PCB unit including a flex PCB located between and connected to two rigid PCBs, the flex PCB defining a second thickness, which is smaller than a first thickness defined by each of the two rigid PCBs;
   an image sensor being flatly attached and electrically connected to the flex PCB;

a lens being aligned with the image sensor and fixed to the flex PCB such that an overall height of the lens and image sensor as flatly attached to the flex PCB is reduced; and a clearance being formed between the lens and each of the two rigid PCBs and filled with a clearance glue so as to reinforce joints of the flex PCB and the rigid PCBs.

2. The lens module mounted on rigid-flex PCB as claimed in claim 1, further comprising a filter superposed on the image sensor.

3. The lens module mounted on rigid-flex PCB as claimed in claim 2, wherein the lens is located in an image sensing light path of the image sensor and the filter is located between the lens and the image sensor.

4. The lens module mounted on rigid-flex PCB as claimed in claim 1, wherein the flex PCB and the rigid PCBs are connected to one another in a manner that does not need any connector or any welding procedure.

5. The lens module mounted on rigid-flex PCB as claimed in claim 1, wherein the image sensor is provided with a plurality of conductors electrically connected to the flex PCB.

6. The lens module mounted on rigid-flex PCB as claimed in claim 1, further comprising a covering covered on each of the two rigid PCBs; and the clearances being formed also between the lens and the coverings, and the clearance glue also being filled between the lens and the coverings.

7. The lens module mounted on rigid-flex PCB as claimed in claim 6, wherein the rigid PCBs respectively have an inner edge located adjacent to the flex PCB; and the lens having two outer sides facing toward and spaced from the two inner edges of the rigid PCBs, and the clearances being formed between the outer sides of the lens and the two inner edges of the rigid PCBs.

8. The lens module mounted on rigid-flex PCB as claimed in claim 7, wherein the coverings respectively have an inner end surface flush with the two inner edges of the rigid PCBs and facing toward but spaced from the two outer sides of the lens; and the clearance glue also being filled between the two inner end surfaces of the coverings and the two outer sides of the lens.

9. The lens module mounted on rigid-flex PCB as claimed in claim 1, wherein the clearance glue is curable glue.

10. The lens module mounted on rigid-flex PCB as claimed in claim 1, wherein the flex PCB forms a recessed area on the rigid-flex PCB unit.

\* \* \* \* \*